United States Patent [19]
Uchida

[11] Patent Number: 6,137,166
[45] Date of Patent: Oct. 24, 2000

[54] SEMICONDUCTOR DEVICE

[75] Inventor: Yasufumi Uchida, Tokyo, Japan

[73] Assignee: Oki Electric Industry Co., Ltd., Tokyo, Japan

[21] Appl. No.: 08/984,049

[22] Filed: Dec. 3, 1997

[30] Foreign Application Priority Data

Mar. 28, 1997 [JP] Japan .................................. 9-076780

[51] Int. Cl.⁷ .................................................. H01L 23/48
[52] U.S. Cl. ........................ 257/691; 257/668; 257/678; 257/784
[58] Field of Search .................................. 252/668, 691; 257/668, 691, 784, 666, 676

[56] References Cited

U.S. PATENT DOCUMENTS 5,252,854  10/1993  Arita et al. .............................. 257/676
5,319,241  6/1994  Lim .

FOREIGN PATENT DOCUMENTS 5-114622   5/1993   Japan .
6-283659  10/1994   Japan .

*Primary Examiner*—Roy Potter
*Attorney, Agent, or Firm*—Rabin & Champagne, P.C.

[57] ABSTRACT

A semiconductor device including electrode pads on a semiconductor element, leads coupled with some of the electrode pads via bonding wires, and common lines provided on the semiconductor element that achieve electrical continuity for other electrode pads that handle a common signal. At least the surfaces of the common lines are covered with an insulating member such as an insulating adhesive tape. With this, the loops of the bonding wires can be lowered, thereby achieving a thinner package.

16 Claims, 7 Drawing Sheets

[PRIOR ART]

[PRIOR ART]

SEMICONDUCTOR DEVICE

BACKGROUND OF THE INVENTION

The present invention relates to a semiconductor device and a method for manufacturing this semiconductor device. In particular, it relates to a semiconductor device provided with common lines that provide electrical continuity for electrode pads that handle a common signal among a plurality of electrode pads provided on a semiconductor element and to a method for manufacturing this semiconductor device.

FIG. 6 is a schematic drawing that illustrates an example from the prior art. This semiconductor device is constituted of an LOC (lead-on-chip) structure, and is provided with a chip-type semiconductor element 1, a plurality of leads L and common lines 2a' and 2b' connected via an insulating tape T on the semiconductor element 1.

In addition, of the plurality of electrode pads, electrode pads P1 source supply are connected with the common line 2a' through bonding wires W, and electrode pads P2 for ground are connected with the common line 2b' through bonding wires W. Through these connections, the common line 2a' constitutes a source supply line and the common line 2b' constitutes a ground line.

Furthermore, electrode pads Pa and Pb are connected with the common line 2a' which constitutes the source supply line via bonding wires W, and electrode pads Pc, Pd, Pe and Pf are connected to the common line 2b' which constitutes the ground line through bonding wires W. It is to be noted that other electrode pads are directly coupled with leads L through bonding wires W.

In recent semiconductor devices, miniaturization of the semiconductor element 1 has necessitated extremely fine internal wiring. Because of this, if the connections of the electrode pads P1 for source supply and the electrode pads P2 for ground are implemented within the semiconductor element 1, degradation in performance characteristics will occur due to a reduction in voltage. Therefore, they are wired electrically, utilizing the common lines 2a' and 2b'.

However, such a semiconductor device presents the following problem. Namely, when the electrode pads P and the leads L are coupled through the bonding wires W, as shown in FIG. 7(a), it is necessary to loop the wires over the common lines 2a' and 2b', allowing a sufficient clearance H in order to avoid contact with them.

Normally, the common lines 2a' and 2b' are formed as lead frames that are integrated with the leads L, and their thickness is set at approximately 150 micrometer. Thus, it becomes necessary to allow approximately 400 micrometer or more for the loop height of the bonding wires W in order to ensure that it does not make contact with the common lines 2a' and 2b'.

However, if the loop height is set high in this manner, when forming a thin package PC as shown in FIG. 7(b), a problem occurs in that the bonding wires are not contained within the package PC and become exposed.

SUMMARY OF THE INVENTION

The present invention has been completed by addressing the problem of the semiconductor devices in the prior art and the manufacturing method thereof discussed above. Its first object is to provide a new and improved semiconductor device with which, even when the bonding wires are to be connected astride the common lines, it is not necessary to take into consideration the possibility of electrical contact between the common lines and the bonding wires, and a method for manufacturing such a semiconductor device.

Another object of the present invention is to provide a new and improved semiconductor device with which, even when the bonding wires are to be connected astride the common lines, it is possible to lower the loops of the bonding wires to achieve a thinner semiconductor device package and a method for manufacturing such a semiconductor device.

Yet another object of the present invention is to provide a new and improved semiconductor device with which reliability of the product is improved by inhibiting the bonding wires from being crushed or becoming deformed and a method for manufacturing such a semiconductor device.

In order to achieve the objects described above, the semiconductor device in a first aspect of the present invention comprises a plurality of electrode pads provided on a semiconductor element, leads that are coupled with the electrode pads via bonding wires and common lines that provide a state of electrical continuity for electrode pads that handle a common signal among the plurality of electrode pads positioned on the semiconductor element, with an insulating member laid over at least the surfaces of the common lines.

With this structure, since the insulating member is laid over at least the surfaces of the common lines which provide electrical continuity for electrode pads that handle a common signal among the plurality of electrode pads positioned on the semiconductor element, no electrical connection occurs even when the bonding wires, which are laid out astride the common lines come in contact with them, because of the insulating member. In other words, it becomes unnecessary to take into consideration the possibility of electrical contact between the bonding wires and the common lines, thus making it possible to reduce the height of the loops in the bonding wires.

In addition, in order to achieve the objects described above, the method for manufacturing the semiconductor device in a second aspect of the present invention comprises a process in which a first insulating adhesive tape is applied to the semiconductor element while avoiding contact with the plurality of electrode pads, a process in which electrically conductive adhesive is laminated on the first insulating adhesive tape on the semiconductor element in a state in which electrical continuity is achieved with electrode pads that handle a common signal, a process in which a second insulating adhesive tape is laminated so as to cover the surface of the conductive adhesive and a process in which the electrode pads that have neither the conductive adhesive nor the second insulating adhesive tape covering them are connected with leads for performing signal input/output through bonding wires that are wired astride and in contact with the second insulating adhesive tape.

In this method, since the conductive adhesive is laminated on the first insulating adhesive tape which is applied onto the semiconductor element so as to avoid contact with the plurality of electrode pads in a state in which the conductive adhesive is electrically continuous with electrode pads that handle a common signal and the second insulating adhesive tape is laminated over the surface of the conductive adhesive, the conductive adhesive that is enclosed by the insulating members can be utilized as a common line. Furthermore, by laying out the bonding wires in a state in which they lie astride the second insulating adhesive tape and are in contact with the second insulating adhesive tape, the bonding wires are supported by the second insulating adhesive tape.

PREFERRED EMBODIMENTS OF THE INVENTION

Figure 1:
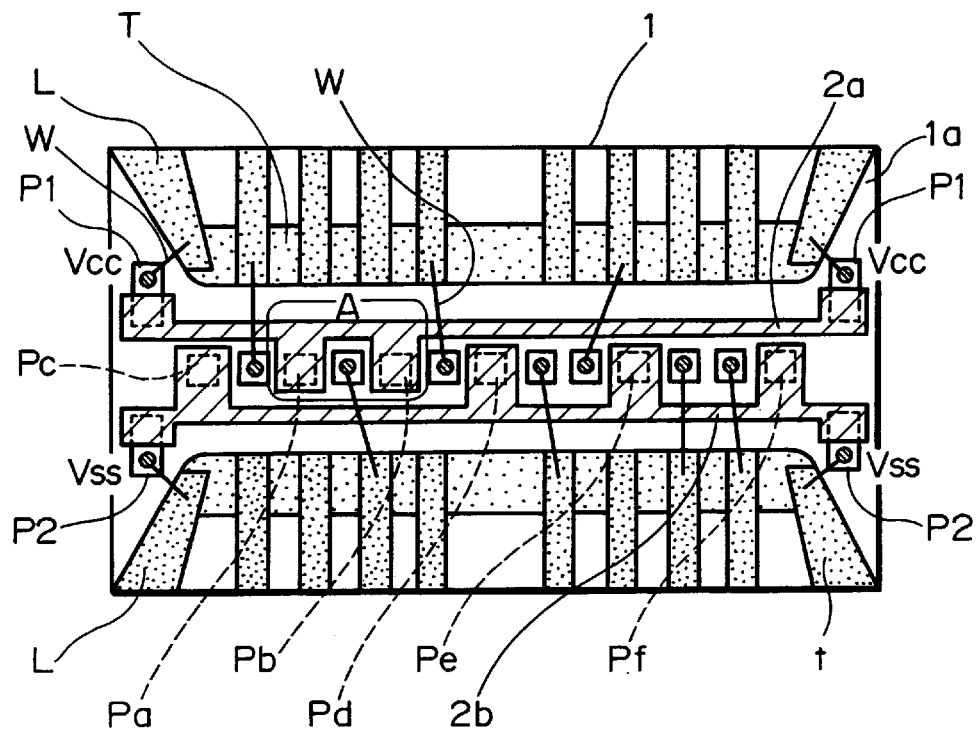
FIG. 1 is a schematic drawing illustrating a first embodiment.
Figure 1:
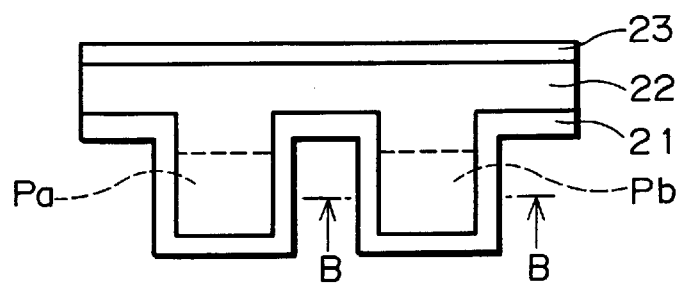
Figure 1:
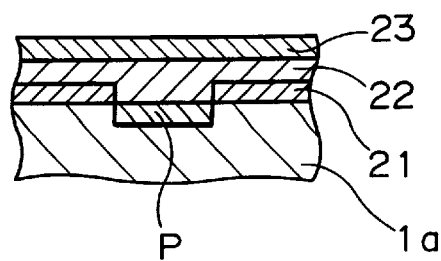

The following is an explanation of the semiconductor device and the manufacturing method thereof according to the present invention in reference to embodiments. FIG. 1 is a schematic drawing illustrating the first embodiment. As the schematic plan view in FIG. 1(a) illustrates, the semiconductor device in the first embodiment has an LOC structure, and is provided with a chip-type semiconductor element 1, a plurality of leads L and common lines 2a and 2b connected via an insulating tape T on the semiconductor element 1 for achieving electrical continuity of the electrode pads that handle a common signal among the plurality of electrode pads provided on the substrate 1a and bonding wires W for electrically coupling the electrode pads with the leads L.

In this semiconductor device, the common line 2a constitutes a source supply line through electrical continuity with electrode pads P1 for source supply, whereas the common line 2b constitutes a ground line through electrical continuity with electrode pads P2 for ground.

In addition, the common line 2a is also electrically continuous with electrode pads Pa and Pb, which receive the source supply, and the common line 2b is also electrically continuous with electrode pads Pc, Pd, Pe and Pf, which constitute grounds. It is to be noted that the remaining electrode pads are connected with the leads L through the bonding wires W which lie astride the common lines 2a and 2b.

FIG. 1(b) is an enlargement of the area A in FIG. 1(a) and FIG. 1(c) is a cross section through line B—B in FIG. 1(b) viewed from the direction indicated by the arrows. As shown in the figures, the common lines 2a and 2b in the first embodiment each have a 3-layer laminated structure. Namely, a first insulating adhesive tape 21 constituting the lowermost layer, a conductive adhesive 22 constituting an intermediate layer and a second insulating adhesive tape 23 constituting the uppermost layer. It is to be noted that FIG. 1(b) shows a state in which only the conductive adhesive 22 is formed on the first insulating adhesive tape 21 constituting the lowermost layer.

The first insulating adhesive tape 21, which is constituted by applying a thermoplastic adhesive on tape, is applied onto the substrate 1a with holes formed in the tape to coincide with the positions of the electrode pads so that the electrode pads may come in contact with a common line 2a or 2b on the substrate 1a. In addition, the conductive adhesive 22 is a thermosetting adhesive and makes contact with the electrode pads via the holes in the first insulating adhesive tape 21.

In addition, the second insulating adhesive tape 23, which, like the first insulating adhesive tape 21, is constituted by applying a thermoplastic adhesive on tape, is applied covering at least the surface of the conductive adhesive 22.

For instance, at the common line 2a for source supply, holes are formed in the first insulating adhesive tape 21 constituting the lower layer to coincide with the positions of the electrode pads P1 and the electrode pads Pa and Pb, and an electrically continuous line for obtaining source is constituted with the conductive adhesive 22 entering these holes and also applied on the first insulating adhesive tape 21. In addition, with the second insulating adhesive tape covering at least the surface of the conductive adhesive 22, insulation between the conductive adhesive 22 and the bonding wires W is achieved.

Moreover, at the common line 2b for ground, holes are formed in the first insulating adhesive tape 21 constituting the lower layer to coincide with the positions of the electrode pads P2 and the electrode pads Pc, Pd, Pe and Pf, and an electrically continuous line for obtaining ground is constituted with the conductive adhesive 22 entering these holes and also applied on the first insulating adhesive tape 21. With the second insulating adhesive tape covering at least the surface of the conductive adhesive 22, insulation between the conductive adhesive 22 and the bonding wires W is achieved.

The thickness of each of the common lines 2a and 2b is approximately 45~50 micrometer (the first insulating adhesive tape 21 and the second insulating adhesive tape 23 are each approximately 20 micrometer in thickness and the conductive adhesive 22 is approximately 5 micrometer in thickness) and by setting these dimensions thus, the loop height of the bonding wires W, which lie astride these lines, can be reduced compared to that in the prior art. Moreover, because of the second insulating adhesive tape 23 formed on the surface, no short circuit occurs even if the bonding wires W come in contact with the common lines 2a and 2b.

Next, the method for manufacturing this semiconductor device is explained. First, with the holes formed at positions that coincide with the electrode pads P1, Pa and Pb, which handle a source signal at the semiconductor element 1, the first insulating adhesive tape 21 is applied under heat and pressure, and with the holes formed at positions that coincide with the electrode pads P2, Pc, Pd, Pe and Pf, which handle a ground signal, the first insulating adhesive tape 21 is applied under heat and pressure. After this, the conductive adhesive 22 is applied over the first insulating adhesive tape 21 while ensuring that the conductive adhesive 22 enters the holes. At this point, the conductive adhesive 22 should be applied over a width which is smaller than the width of the first insulating adhesive tape 21.

Figures 2A, 2B, 2C:
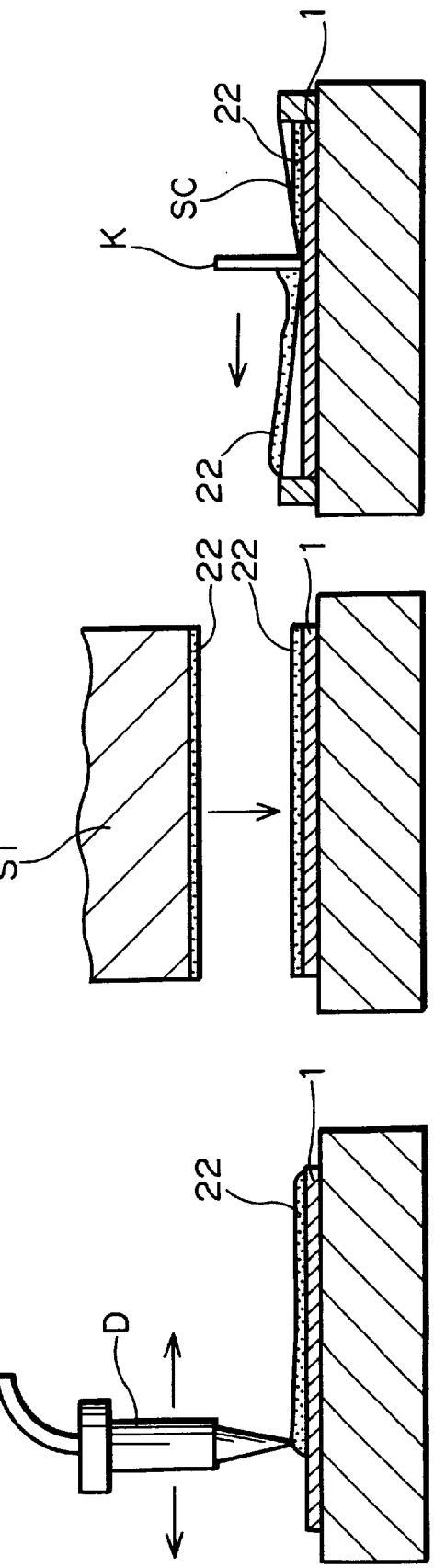
FIG. 2 is a schematic cross section illustrating the application of the conductive adhesive.

FIG. 2 is a schematic cross section illustrating the application of the conductive adhesive. FIG. 2(a) shows an example in which a dispenser D is employed, and in this example, the conductive adhesive 22 is applied at the desired position by moving the dispenser D over the first insulating adhesive tape (not shown) on the semiconductor element 1 with the conductive adhesive 22 discharged from the tip of the dispenser D.

FIG. 2(b) shows an example in which a stamper ST is employed. In this example, conductive adhesive 22 is adhered to the lower surface of the stamper ST having a specific shape, and is laminated onto the first insulating adhesive tape (not shown) at the semiconductor element 1 through stamping.

FIG. 2(c) shows an example that employs screen printing. In this example, a screen SC is positioned on the semiconductor element 1 and by spreading the conductive adhesive 22 onto the screen SC with a squeegee K, the conductive adhesive 22 is laminated onto the first insulating adhesive tape (not shown) at the semiconductor element 1 via openings of a specific shape provided in the screen SC.

After the conductive adhesive 22 is applied through one of the methods described above, the second insulating adhesive tape is applied so that the conductive adhesive 22 is thoroughly covered. After this, heat is applied to achieve a specific temperature, causing the conductive adhesive 22 to become thermally set to form the common line 2a or 2b with a 3-layer structure.

Next, the electrode pads that are not connected with the common line 2a or 2b are electrically coupled with the leads L through the bonding wires W. In this wiring, the bonding wires W lie astride the common lines 2a and 2b and are also supported by and in contact with the second insulating adhesive tape 23 on the surfaces of the common lines 2a and 2b. This achieves a lower loop for the bonding wires W and also a sufficient degree of shape retention.

After the bonding wires W are connected, the entirety of the semiconductor element 1 is sealed into a package with a molding resin (not shown). In this embodiment, since the loops of the bonding wires W can be lowered compared to the prior art, the thickness of the molding resin, too, can be reduced.

It is to be noted that while, in reference to the manufacturing method described above, an explanation has been given of an example in which the first insulating adhesive tape 21 is applied after the semiconductor element 1 is formed (partitioned), the first insulating adhesive tape 21 may be applied in advance, before the wafer is partitioned into semiconductor elements 1.

Next, the second embodiment of the present invention is explained. FIG. 3 is a schematic drawing illustrating the second embodiment, with FIG. 3(a) presenting a schematic plan view, FIG. 3(b) presenting an enlargement of the area A' in FIG. 3(a) and FIG. 3(c) presenting a cross section through line B'—B' in FIG. 3(d) viewed from the direction indicated by the arrows.

Figure 3A:
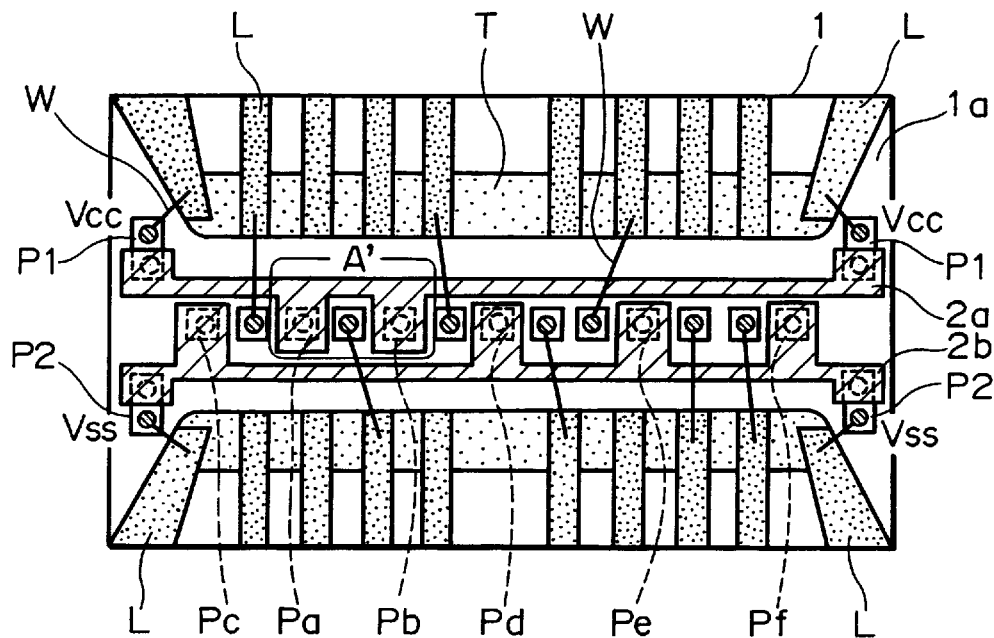
FIG. 3 is a schematic drawing illustrating a second embodiment.

As shown in FIG. 3(a) the semiconductor device in the second embodiment has an LOC structure, and is provided with an on-chip semiconductor element 1, a plurality of leads L connected on a substrate 1a of the semiconductor element 1 via an insulating tape T, common lines 2a and 2b for achieving electrical continuity of the electrode pads that handle a common signal among the plurality of electrode pads provided on the substrate 1a and bonding wires W for electrically coupling the electrode pads with the leads L.

Figure 3B:
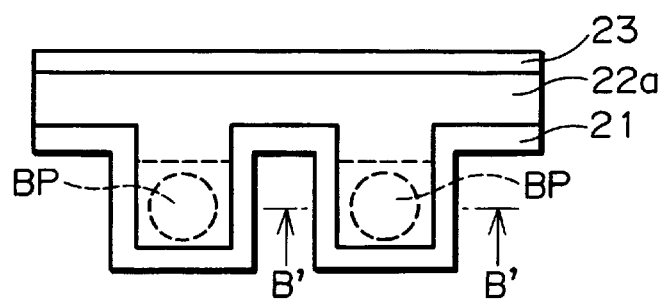
Figure 3C:
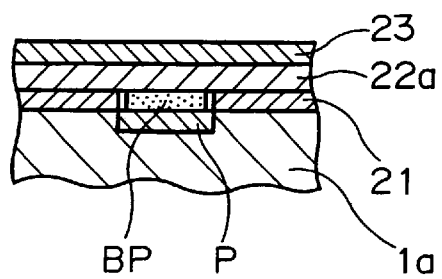

In addition, in the second embodiment, the common line 2a, which is electrically continuous with the electrode pads Pa and Pb that receive the source supply, and the common line 2b, which is electrically continuous with the electrode pads Pc, Pd, Pe and Pf constituting the ground, are each constituted of a 3-layer structure (a first insulating adhesive tape 21, a copper foil 22a, a second insulating adhesive tape 23) with the copper foil 22a and the electrode pads connected via metal bumps BP (see FIGS. 3(a) and 3(b)). It is to be noted that FIG. 3(b) shows a state in which only the copper foil 22a is formed on the first insulating adhesive tape 21 constituting the lowermost layer.

The first insulating adhesive tape 21, which is constituted by applying a thermosetting adhesive on a tape, is applied in a state in which holes are formed in the tape at positions that coincide with the positions of electrode pads so that they may come in contact with the common line 2a or 2b on the substrate 1a. In addition, on the first insulating adhesive tape 21, the copper foil 22a is laminated via the metal bumps BP positioned at the holes. Moreover, the second insulating adhesive tape 23 which, like the first insulating adhesive tape 21, is constituted by applying a thermosetting adhesive on tape, is applied to cover at least the surface of the copper foil 22a.

In the common line 2a for source supply, the holes are formed in the first insulating adhesive tape 21 constituting the lower layer at positions that coincide with the positions of the electrode pads P1 and the electrode pads Pa and Pb and an electrically continuous line for obtaining the source is constituted with the copper foil 22a via the metal bumps BP positioned at those holes. In addition, by covering at least the surface of the copper foil 22a with the second insulating adhesive tape, the copper foil 22a is insulated from the bonding wires W.

Moreover, in the common line 2b for ground, the holes are formed in the first insulating adhesive tape 21 constituting the lower layer at positions that coincide with the positions of the electrode pads P2 and the electrode pads Pc, Pd, Pe and Pf, and an electrically continuous ground line is constituted with the copper foil 22a via the metal bumps BP positioned at those holes. By covering at least the surface of the copper foil 22a with the second insulating adhesive tape, the copper foil 22a is insulated from the bonding wires W.

The thickness of each of the common lines 2a and 2b is approximately 45~50 micrometer (the first insulating adhesive tape 21 and the second insulating adhesive tape 23 are approximately 20 micrometer each in thickness and the copper foil 22a is approximately 5 micrometer in thickness) and by setting their dimensions thus, the loop height of the bonding wires W that lie astride these lines can be reduced compared to that in the prior art. Moreover, because of the second insulating adhesive tape 23 formed on the surface, no short circuit occurs even if the bonding wires W come in contact with the common lines 2a and 2b.

Next, the method for manufacturing this semiconductor device is explained. First, the first insulating adhesive tape 21 with a thermosetting adhesive applied on its upper surface and lower surface is applied onto the substrate 1a under heat and pressure. In the case of the common line 2a, the first insulating adhesive tape 21 is applied with the holes formed at positions that coincide with the positions of the electrode pads P1, Pa and Pb that handle the source signal, whereas in the case of the common line 2b, the first insulating adhesive tape 21 is applied with the holes formed at positions that coincide with the positions of the electrode pads P2, Pc, Pd, Pe and Pf that handle the ground signal. It is to be noted that it is assumed that a metal bump BP is provided on each of the electrode pads within these holes.

The copper foil 22a is then adhered onto the first insulating adhesive tape 21 under pressure. The second insulating adhesive tape 23, with a thermosetting adhesive applied onto its lower surface, is then adhered onto the copper foil 22a under pressure. The width of the copper foil 22a that is adhered should be smaller than the width of the first insulating adhesive tape 21 and the second insulating adhesive tape 23.

After this, heat and pressure are applied from above the second insulating adhesive tape 23. With this, a state in which the copper foil 22a and the metal bumps BP are in contact is achieved. Then, in this state, heat is applied to the semiconductor element 1. Through this heat application, the thermosetting adhesive applied to the first insulating adhesive tape 21 and the second insulating adhesive tape 23 sets and contracts so that the copper foil 22a and the metal bumps BP come very firmly into contact with each other.

Next, the electrode pads that are not connected with the common lines 2a or 2b are electrically coupled with the leads L through the bonding wires W. In this wiring, the bonding wires W lie astride the common lines 2a and 2b and are also supported by and in contact with the second insulating adhesive tape 23 on the surfaces of the common lines 2a and 2b. This achieves a lower loop for the bonding wires W and also a sufficient degree of shape retention.

After the bonding wires W are connected, the entirety of the semiconductor element 1 is sealed into a package with a molding resin (not shown). In this embodiment, since the loops of the bonding wires W are low compared to the prior art, the thickness of the molding resin, too, can be reduced.

Furthermore, since the copper foil 22a is used to constitute the electrically continuous area of the common lines 2a and 2b, it becomes possible to achieve an improvement in the electrical characteristics, since the electrically continuous lines will have low resistance.

Next, the third embodiment of the present invention is explained. FIGS. 4 and 5 are schematic drawings illustrating the third embodiment, with FIG. 4(a) presenting a schematic plan view, FIG. 4(b) presenting an enlargement of the area C in FIG. 4(a), FIG. 5(a) showing the shape of the first conductive adhesive, FIG. 5(b) presenting a cross section through line D—D in FIG. 4(b) viewed from the direction indicated with the arrow and FIG. 5(c) presenting a schematic cross section illustrating a packaged state.

Figure 4A:
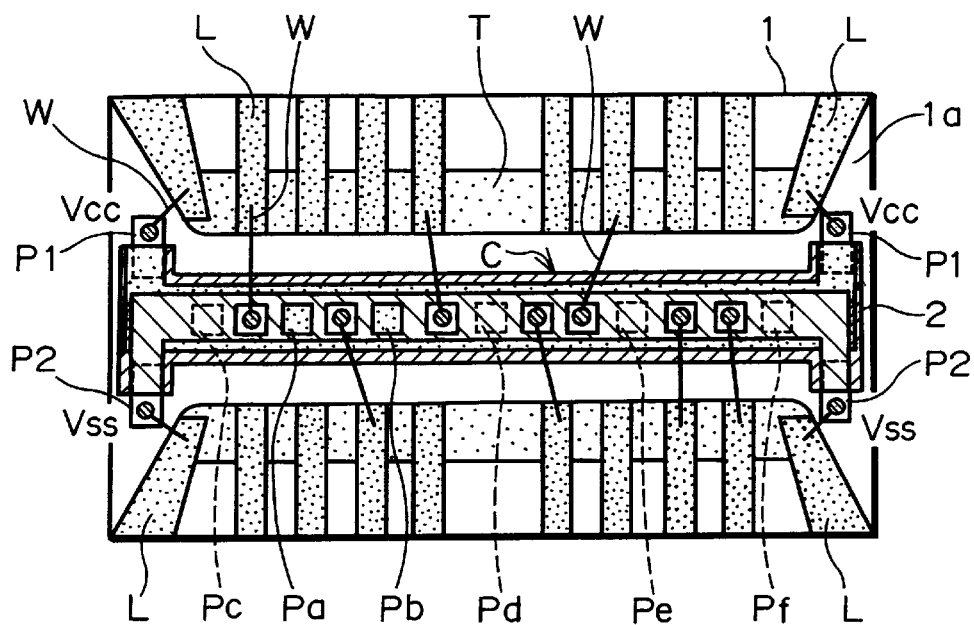
FIG. 4 is a schematic drawing illustrating a third embodiment.
Figure 5A:
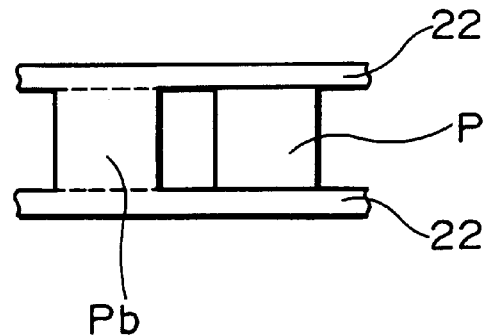
FIG. 5 is a schematic drawing illustrating the third embodiment.

FIG. 4(a) illustrates the semiconductor device in the third embodiment, which has an LOC structure and is provided with an on-chip semiconductor element 1, a plurality of leads L connected on a substrate 1a of the semiconductor element 1 via an insulating tape T, common lines 2a and 2b for achieving electrical continuity of the electrode pads that handle a common signal among the plurality of electrode pads provided on the substrate 1a and bonding wires W for electrically coupling the electrode pads with the leads L.

In particular, the third embodiment is characterized in that the line electrically continuous with the electrode pads Pa and Pb, which receives source supply, and the line electrically continuous with the electrode pads Pc, Pd, Pe and Pf constituting the ground, are constituted with a 5-layer.

Figure 4B:
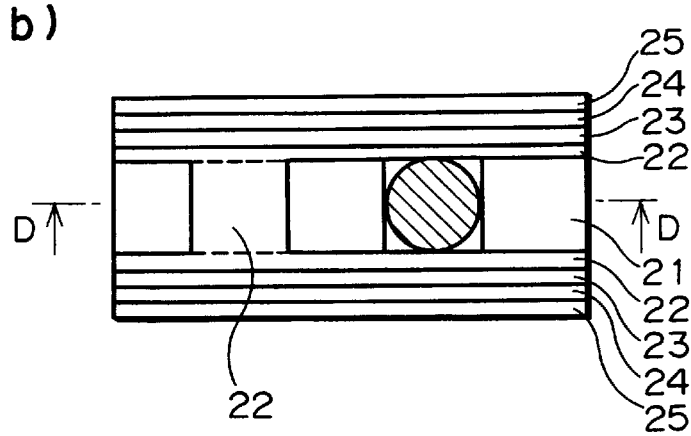
Figure 5B:
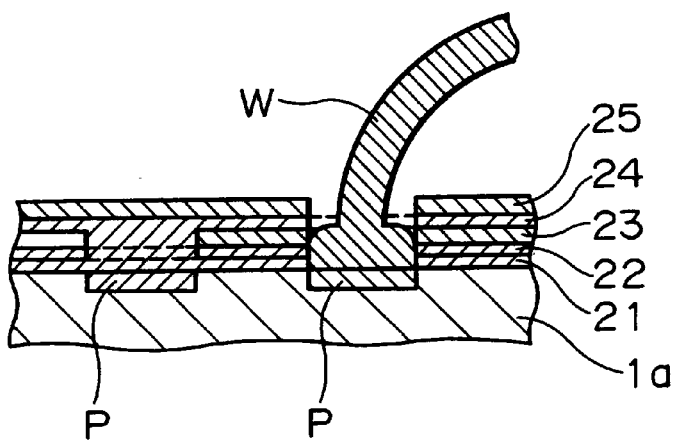
Figure 5C:
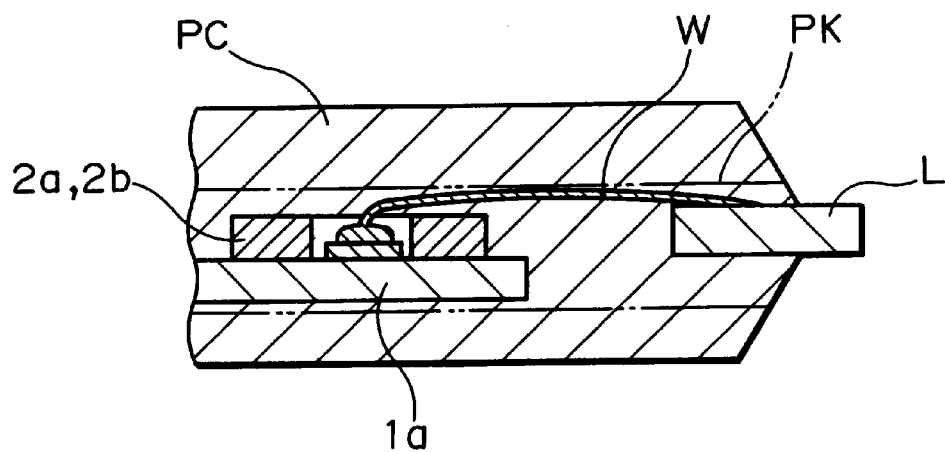
Figure 6:
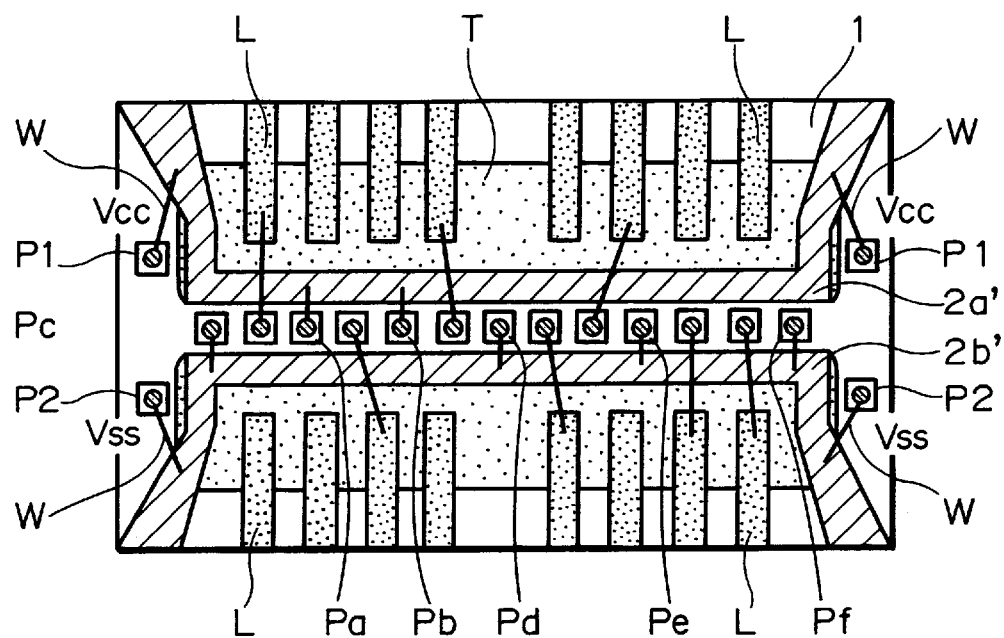
FIG. 6 is a schematic drawing illustrating an example from the prior art.
Figure 7A:
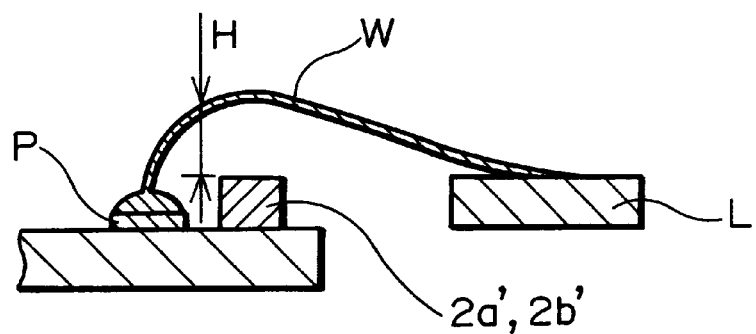
FIG. 7 is a schematic drawing illustrating an example from the prior art.
Figure 7B:
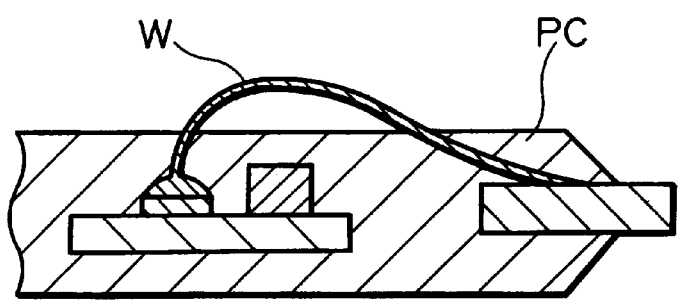

As shown in FIG. 4(b) and FIG. 5(b), the 5-layer structure is achieved by sequentially laminating a first insulating adhesive tape 21 constituting the lowermost layer, a first conductive adhesive 22 toward the lower layer, a second insulating adhesive tape 23 constituting an intermediate layer, a second conductive adhesive 24 toward the upper layer and a third insulating adhesive tape 25 constituting the uppermost layer.

The first insulating adhesive tape 21, which is constituted by applying a thermoplastic adhesive onto tape, is applied with holes formed at positions coinciding with the positions of electrode padsfor source supply (including other electrode pads continuous with these electrode pads in subsequent explanations) and with holes formed at positions coinciding with the positions of the electrode pads for ground (including other electrode pads continuous with these electrode pads in subsequent explanations). The same connected applications to the explanation below of the second tape.

In addition, the first conductive adhesive 22 is applied so that it enters the holes in the first insulating adhesive tape 21 at positions corresponding to the electrode pads for source supply (e.g., electrode pad Pa) while avoiding the positions of other electrode pads P (see FIG. 5(a)).

The second insulating adhesive tape 23, which is constituted by applying a thermoplastic adhesive onto tape, is applied covering the surface of the first conductive adhesive 22. It is to be noted that holes are formed in this second insulating adhesive tape 23 at positions that correspond to the positions of the electrode pads for ground and other electrode pads (electrode pads other than those for source supply or ground).

The second conductive adhesive 24 is applied so that it enters the holes in the second insulating adhesive tape 23 formed at positions corresponding to the electrode pads for ground (e.g., electrode pad Pa) while avoiding the positions of other electrode pads P (electrode pads other than those for source supply or ground).

Furthermore, the third insulating adhesive tape 25, which is constituted by applying a thermoplastic adhesive onto tape, is applied covering the surface of the second conductive adhesive 24. Holes are formed in this third insulating adhesive tape 23 at positions that correspond to the positions of the electrode pads other than those for source supply or ground.

As a result, with these 5-layer common lines, the first conductive adhesive 22 toward the lower layer constitutes a continuous line for source supply whereas the second conductive adhesive 24 toward the upper layer constitutes the continuous line for ground. In addition, with the first conductive adhesive 22 and the second conductive adhesive 24 achieving a laminated structure, each of them passes on both sides of the electrode pads.

Moreover, with the holes formed over the electrode pads other than those for source supply or ground in the common lines 2, the bonding wires W are connected at these holes to achieve electrical coupling with the leads L.

With the third insulating adhesive tape 25 attached to the surface of the common line 2, it is possible to avoid short circuiting with the first conductive adhesive 22 and the second conductive adhesive 24 even when the bonding wires W come in contact.

Next, a method for manufacturing this semiconductor device is explained. First, the first insulating adhesive tape 21 with holes formed at positions that coincide with the individual electrode pads is adhered under heat and pressure.

Then, the first conductive adhesive 22 is applied onto the first insulating adhesive tape 21. The first conductive adhesive 22 is applied so that it passes over both sides of each electrode pad and enters only into the holes formed over the electrode pads P1, Pa and Pb that handle the source signal (see FIG. 5(a)). The application of the first conductive adhesive 22 is performed by employing one of the methods illustrated in FIGS. 2(a)~2(c), as in the first embodiment.

After this, the second insulating adhesive tape 23 is adhered onto the first conductive adhesive 22 under heat and pressure. It is to be noted that holes are formed in the second insulating adhesive tape 23 at positions that coincide with the positions of the electrode pads P2, Pa, Pd, Pe and Pf for ground and also with other electrode pads (electrode pads other than those for source supply or ground).

Then, the second conductive adhesive 24 is applied onto the second insulating adhesive tape 23. The second conductive adhesive 24 is applied so that it passes over both sides of each electrode pad and enters only into the holes formed over the electrode pads P2, Pc, Pd, Pe and Pf that handle the ground signal. The application of the second conductive adhesive 24 is performed by employing one of the methods illustrated in FIGS. 2(a)–2(c), as in the case of the first conductive adhesive 22.

The third insulating adhesive tape 25 is adhered under heat and pressure onto the second conductive adhesive 24 thus applied. The third insulating adhesive tape 25 covers the second conductive adhesive 24. It is to be noted that holes are formed in the third conductive adhesive tape 25 at positions that coincide with the positions of electrode pads other than those for source supply or ground.

After forming the 5-layer common lines 2 through lamination, the semiconductor element 1 is heated. Through this heating, the thermoplastic adhesive is set, thereby bonding the individual layers.

After this, the electrode pads that are not connected to the common lines 2 are electrically coupled with the leads L through the bonding wires W. Through this wiring, the bonding wires W achieve a state in which they lie astride the common lines 2 and are supported by and in contact with the third insulating adhesive tape 25 on the surfaces of the common lines 2. With this, a lower loop is achieved for the bonding wires W and, at the same time, sufficient shape retention is achieved.

After the bonding wires W are connected, the entirety of the semiconductor element 1 is sealed with a molding resin, as shown in FIG. 5(e), to constitute a package PC. Since the loops of the bonding wires W in this embodiment can be low compared to the prior art, the thickness of the package PC can be reduced to that indicated with the 2-point chain line in the figure.

In the third embodiment, by constituting the common lines 2 as a 5-layer structure, a state is achieved in which independent continuous lines independently pass over both sides of the electrode pads, thereby increasing the overall width (area of adhesion). Thus, it becomes possible to achieve an improvement in the reliability through an increase in the bonding force among the individual layers. In particular, this effect becomes more marked as the pitch of the individual electrode pads becomes smaller.

While the preferred embodiments of the semiconductor device and its manufacturing method according to the present invention have been explained in reference to the attached drawings, the present invention is not limited to these examples, and it will be understood by those skilled in the art that various changes and modifications in form and detail may be made therein without departing from the spirit, scope and teaching of the invention.

For instance, while in all the embodiments explained above, the source line for source supply and the ground line for grounding constitute the common lines, the present invention is not restricted to these examples, and any line for achieving electrical continuity for a plurality of electrode pads that handle a common signal may constitute a common line. In other words, aluminum wiring or the like inside the semiconductor element 1 may be used as a common line.

In addition, when placing common lines and the bonding wires W in contact with each other, accurate support is achieved by laying out the bonding wires W in polygonal shapes (in a trapezoid shape, for instance) to achieve in-line contact with the common lines in the area where the bonding wire W is almost horizontal constituting the upper side of the polygon.

As has been explained, the following advantages are achieved through the semiconductor device and its manufacturing method according to the present invention. Namely, even when the bonding wires are connected astride common lines, it is not necessary to take into consideration the possibility of electrical contact between the common lines and the bonding wires, thereby making it possible to reduce the height of the loops of the bonding wire. Thus, a thinner package is achieved for the semiconductor device.

In addition, by placing the bonding wires in contact with the insulating adhesive tape applied onto the surfaces of the common lines when laying out the bonding wires, it becomes possible to support the bonding wires, thereby preventing the bonding wires from being crushed or becoming deformed to provide a semiconductor device with a high degree of reliability.

What is claimed is:

1. A semiconductor device, comprising:
   a semiconductor element having a semiconductor surface;
   a plurality of electrode pads on the semiconductor surface, the electrode pads including common signal electrode pads to which common signals are applied;
   a plurality of leads;
   insulating tape fixing the leads on the semiconductor surface;
   bonding wires coupling the leads to the electrode pads; and
   common lines formed on the semiconductor and connecting the common signal electrode pads, the common lines including a first insulating member formed on the semiconductor surface, a conductive member formed on the first insulating member and a second insulating member formed on the conductive member, wherein the conductive members of the common lines pass over and contact the common signal electrode pads.

2. A semiconductor device, comprising:
   a semiconductor element having a semiconductor surface;
   a plurality of electrode pads on the semiconductor surface, the electrode pads including common signal electrode pads to which common signals are applied;
   a plurality of leads;
   insulating tape fixing the leads on the semiconductor surface;
   bonding wires coupling the leads to the electrode pads; and
   common lines formed on the semiconductor and connecting the common signal electrode pads, the common lines including a first insulating member formed on the semiconductor surface, a conductive member formed on the first insulating member and a second insulating member formed on the conductive member;
   wherein for each of the common lines the first insulating member is a first insulating adhesive tape adhered to the semiconductor element, and the second insulating member is a second insulating adhesive tape;
   wherein the first insulating adhesive tape has holes therein at positions coinciding with individual ones of the common signal electrode pads so as to be aligned therewith, further comprising respective conductive members embedded in the holes so as to be in electrical contact both with the electrode pads with which the holes are aligned and with the conductive layer, whereby the individual electrode pads are maintained electrically continuous with each other via the embedded conductive members and the conductive layer.

3. A semiconductor device according to claim 2, wherein each of the conductive members is constituted of a conductive adhesive.

4. A semiconductor device according to claim 2, wherein each of the conductive members is constituted of a metal foil.

5. A semiconductor device according to claim 4, wherein the first insulating adhesive tape holes has holes therein at positions corresponding to the individual common signal electrode pads and electrically continuous via metal bumps provided inside the holes and also via the metal foil.

6. A semiconductor device, comprising:

a semiconductor element having a semiconductor surface;

a plurality of electrode pads on the semiconductor surface, the electrode pads including common signal electrode pads to which common signals are applied;

a plurality of leads;

insulating tape fixing the leads on the semiconductor surface;

bonding wires coupling the leads to the electrode pads; and common lines formed on the semiconductor and connecting the common signal electrode pads, the common lines including a first insulating member formed on the semiconductor surface, a conductive member formed on the first insulating member and a second insulating member formed on the conductive member, wherein the common lines include a source common line and a ground common line, the ground common line being electrically independent of the source common line at the semiconductor element.

7. A semiconductor device, comprising:

a semiconductor element having a semiconductor surface;

a plurality of electrode pads on the semiconductor surface, the electrode pads including common signal electrode pads to which common signals are applied;

a plurality of leads;

insulating tape fixing the leads on the semiconductor surface;

bonding wires coupling the leads to the electrode pads; and common lines formed on the semiconductor and connecting the common signal electrode pads, the common lines including a first insulating member formed on the semiconductor surface, a conductive member formed on the first insulating member and a second insulating member formed on the conductive member, wherein the insulating tape fixing the leads on the semiconductor surface is spaced from both the first insulating member and the second insulating member.

8. A semiconductor device, comprising:

a semiconductor element having a semiconductor surface;

a plurality of electrode pads on the semiconductor surface, the electrode pads including common signal electrode pads to which common signals are applied;

a plurality of leads;

insulating tape fixing the leads on the semiconductor surface;

bonding wires coupling the leads to the electrode pads; and common lines formed on the semiconductor and connecting the common signal electrode pads, the common lines including a first insulating member formed on the semiconductor surface, a conductive member formed on the first insulating member and a second insulating member formed on the conductive member, wherein the conductive members and first and second insulating members of the common lines include insulating adhesive tape and conductive adhesive alternately laminated on the semiconductor element with the insulating adhesive tape constituting forming an uppermost layer thereof.

9. A semiconductor device according to claim 8, wherein the alternately laminated insulating adhesive tape and conductive adhesive of at least one of the common lines comprise first insulating adhesive tape adhered on the semiconductor element, first conductive adhesive on the first insulating adhesive tape, second insulating adhesive tape on the first conductive adhesive, second conductive adhesive on the second insulating adhesive tape and third insulating adhesive tape on the second conductive adhesive.

10. A semiconductor device according to claim 8, wherein the plurality of electrode pads include electrode pads other than the individual common signal electrode pads, and wherein the common lines pass over the semiconductor surface at opposite sides of positions corresponding to the electrode pads other than the common signal individual electrode pads.

11. A semiconductor device according to claim 8, wherein one of the first conductive adhesive and the second conductive adhesive constitutes a source supply line on the semiconductor element and the other of the first conductive adhesive and the second conductive adhesive constitutes a ground line at the semiconductor element.

12. A semiconductor device according to claim 8, wherein the plurality of electrode pads include electrode pads other than the individual common signal electrode pads, wherein the common lines include a source common line and a ground common line, the ground common line being electrically independent of the source common line at the semiconductor element, wherein the common signal electrode pads include first and second common signal electrode pads to which common signals are applied wherein the alternately laminated insulating adhesive tape and conductive adhesive includes first and second conductive adhesive and first, second and third insulating adhesive tape, wherein the first insulating adhesive tape is adhered on the semiconductor element and wherein the first insulating adhesive tape has holes therein at positions corresponding to the individual common signal electrode pads, wherein the first conductive adhesive is formed on the first insulating adhesive tape and is connected through the holes only to the first common signal electrode pads, wherein the second insulating adhesive tape is formed on the first conductive adhesive and has holes therein at positions corresponding to the individual second common signal electrode pads, the second insulating adhesive tape covering the holes through which the first insulating adhesive tape is connected to the first common signal electrode pads, wherein the second conductive adhesive is formed on the second insulating adhesive tape and is connected to the second common signal electrode pads through the holes in the second insulating adhesive tape, and wherein the third insulating adhesive tape is formed on the second conductive adhesive and has holes therein at positions corresponding to the electrode pads other than the common signal individual electrode pads, and wherein the bonding wires coupling the leads to the electrode pads other than the common signal individual electrode pads through the holes at the positions corresponding thereto.

13. A semiconductor device, comprising:

a semiconductor element having a semiconductor surface;

a plurality of electrode pads on the semiconductor surface, the electrode pads including common signal electrode pads to which common signals are applied and other electrode pads;

a plurality of leads;

insulating tape fixing the leads on the semiconductor surface;

common lines formed on the semiconductor and connecting the common signal electrode pads, the common lines including a first insulating member formed on the semiconductor surface, a conductive member formed on the first insulating member and a second insulating member formed on the conductive member, the first and second insulating members being independent of the lead fixing insulating tape; and bonding wires extending over and in contact with the second insulating members of the common lines, to couple the leads to the other electrode pads.

14. A semiconductor device according to claim 13, wherein the common lines include two common lines including a source common line and a ground common line, the ground common line being laterally spaced from the source common line along the semiconductor surface so as to be structurally independent thereof.

15. A semiconductor device according to claim 13, wherein the insulating tape fixing the leads on the semiconductor surface is spaced from both the first insulating member and the second insulating member so as to be structurally independent thereof.

16. A semiconductor device, comprising:

a semiconductor element having a semiconductor surface;

a plurality of electrode pads on the semiconductor surface, the electrode pads including common signal electrode pads to which common signals are applied and other electrode pads;

a plurality of leads;

insulating tape fixing the leads on the semiconductor surface;

common lines, including a source common line and a ground common line, formed on the semiconductor and connecting the common signal electrode pads, the common lines including a first insulating member formed on the semiconductor surface, a conductive member formed on the first insulating member and a second insulating member formed on the conductive member, the first and second insulating members being spaced from both the first insulating member and the second insulating member so as to be structurally independent thereof; and bonding wires extending over and in contact with the second insulating members of the common lines, to couple the leads to the other electrode pads.

* * * * *